(12) United States Patent
Balakrishnan

(10) Patent No.: US 7,038,524 B2
(45) Date of Patent: *May 2, 2006

(54) METHOD AND APPARATUS FOR EXTENDING THE SIZE OF A TRANSISTOR BEYOND ONE INTEGRATED CIRCUIT

(75) Inventor: Balu Balakrishnan, Saratoga, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/079,839

(22) Filed: Mar. 8, 2005

(65) Prior Publication Data

US 2005/0151577 A1 Jul. 14, 2005

Related U.S. Application Data

(63) Continuation of application No. 10/441,790, filed on May 16, 2003, now Pat. No. 6,882,212.

(51) Int. Cl.
*H03K 17/687* (2006.01)

(52) U.S. Cl. .................. 327/434; 327/108; 327/564

(58) Field of Classification Search ........ 327/108–112, 327/427–434, 564–566; 326/62, 82, 83; 307/98, 99
See application file for complete search history.

(56) References Cited

U.S. PATENT DOCUMENTS

| | | | |
|---|---|---|---|
| 5,428,287 A | 6/1995 | Agiman | |
| 5,432,471 A | 7/1995 | Majumdar et al. | |
| 5,461,303 A | 10/1995 | Leman et al. | |
| 5,500,616 A | 3/1996 | Ochi | |
| 5,631,494 A | 5/1997 | Sakurai et al. | |
| 5,675,297 A | 10/1997 | Gose et al. | |
| 5,796,278 A | 8/1998 | Osborn et al. | |
| 5,838,181 A | 11/1998 | Hesterman | |
| 5,947,691 A | 9/1999 | Brown et al. | |
| 6,259,292 B1 | 7/2001 | Congdon | |
| 6,339,262 B1 | 1/2002 | Igarashi et al. | |
| 6,380,644 B1 | 4/2002 | Iliasevitch | |
| 6,531,895 B1 | 3/2003 | Barrett et al. | |
| 6,577,173 B1 * | 6/2003 | Ikezawa | 327/110 |
| 6,737,894 B1 * | 5/2004 | Covino | 327/108 |
| 6,801,054 B1 * | 10/2004 | Hirano | 326/86 |
| 6,882,212 B1 * | 4/2005 | Balakrishnan | 327/434 |

* cited by examiner

*Primary Examiner*—Timothy P. Callahan
*Assistant Examiner*—Hai L. Nguyen
(74) *Attorney, Agent, or Firm*—Blakely Sokoloff Taylor & Zafman LLP

(57) ABSTRACT

A technique for extending the size of a power transistor beyond one integrated circuit. In one embodiment, a method of extending the size of a power transistor beyond one integrated circuit includes a master integrated circuit comprising a master control circuit, master driver circuit and master semiconductor switch and one or more slave integrated circuits comprising a slave semiconductor switch and a slave driver circuit. In one embodiment the master semiconductor switch terminals are coupled to the corresponding slave semiconductor switch terminals. In one embodiment the master driver circuit input and slave driver circuit inputs are coupled to be driven by a control signal being the output of the master control circuit.

16 Claims, 2 Drawing Sheets

METHOD AND APPARATUS FOR EXTENDING THE SIZE OF A TRANSISTOR BEYOND ONE INTEGRATED CIRCUIT

REFERENCE TO PRIOR APPLICATION

This application is a continuation of U.S. application Ser. No. 10/441,790, filed May 16, 2003, now U.S. Pat. No. 6,882,212.

BACKGROUND OF THE INVENTION

1. Field of the Invention

The present invention relates generally to integrated circuits and, more specifically, the present invention relates to integrated circuits that include power transistors.

2. Background Information

Electronic circuits using power transistors have to be designed according to the rating or size of the power transistors being used. The size of the power transistors being used influences their power handling capability, which is specified by the power transistor manufacturers. Since the packages used to house power transistors are limited in size by physical and economic constraints, the size of the power transistors that can be contained in a single package is similarly limited. To effectively extend the size of power transistors where necessary, it is therefore common to design electronic circuits using power transistors with two or more power transistors coupled together. The resulting combination of power transistors is typically controlled with a single control circuit consisting of control circuitry and a single driver circuit to drive the power transistors. Circuits using two or more power transistors coupled in this way require careful use of driver and control circuits, in addition to careful circuit board layout, appropriate to the characteristics of the type of power transistor being used.

Integrated circuits are available that integrate control circuitry, drivers and power transistors. The size of the power transistors used in these integrated circuits is also limited by the packages used to house the integrated circuits. In this case, coupling of additional external power transistors is usually not possible since the integrated power transistor driver circuitry is typically dedicated to the integrated power transistor and no means is provided for the user to access the necessary driver circuitry outputs. With integrated circuits where the outputs of the integrated power transistor driver circuitry are made available, the size and number of external power transistors that can be driven by the integrated driver circuitry is limited by the size of this integrated power transistor driver circuitry.

SUMMARY OF THE INVENTION

A circuit for extending the size of a power transistor is disclosed. In one embodiment an apparatus according to the teachings of the present invention includes a first power transistor on a first integrated circuit chip. The first power transistor has two output terminals and a control terminal. The apparatus also includes a first driver circuit on the first integrated circuit chip. The first driver circuit has a first driver circuit input and a first driver circuit output. The first driver circuit output is coupled to drive the control terminal of the first power transistor. The apparatus further includes a second power transistor on a second integrated circuit chip. The second power transistor has two output terminals and a control terminal. The apparatus also includes a second driver circuit on the second integrated circuit chip. The second driver circuit has a second driver circuit input and a second driver circuit output. The second driver circuit output is coupled to drive the control terminal of the second power transistor. The two output terminals of the first power transistor are coupled to the two output terminals, respectively, of the second power transistor. The first and second driver circuit inputs all coupled to be driven by a single control signal. Additional features and benefits of the present invention will become apparent from the detailed description and figures set forth below.

BRIEF DESCRIPTION OF THE DRAWINGS

The present invention detailed illustrated by way of example and not limitation in the accompanying figures.

DETAILED DESCRIPTION

A novel technique to extend the size of a power transistor (or semiconductor switch) is disclosed. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

In general, a simple and novel technique for extending the size of a power transistor is provided according to embodiments of the present invention by coupling together two or more integrated circuits chips, each of which includes at least a power transistor and power transistor driver circuitry. A control circuit is part of one of the integrated circuits and includes an output that is a control signal. The control signal is coupled to be an input to the power transistor driver circuitry of the two or more integrated circuits that are coupled together. In coupling two or more integrated circuits in this way, the power transistor driver circuitry is extended as appropriate to the extension of the power transistor in accordance with the teachings of the present invention.

Figure 1:
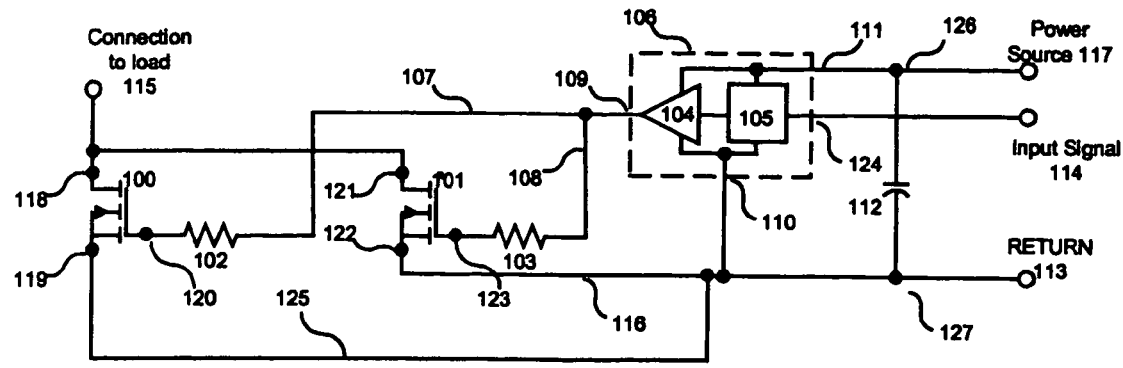
FIG. 1 is a schematic illustrating a circuit where the size of the power transistor has been extended by coupling two power transistors to be driven by a single power transistor driver circuit.

To illustrate, FIG. 1 shows a schematic of a circuit where two power transistors 100 and 101 are coupled together with a common connection to a load 115. Since power transistors 100 and 101 are not part of any integrated circuit, they are often described as discrete power transistors. In this way, the effective size of the power transistor is extended. Output terminals, 118 and 121, of power transistors 100 and 101 are coupled together. Output terminals, 119 and 122, of power transistors 100 and 101 are coupled together. Control terminals 120 and 123 of power transistors 100 and 101, respectively, are coupled together through resistors 102 and 103. Resistors 102 and 103 are in turn coupled together to driver circuit output 109 of driver circuit 104.

In the example shown, driver circuit 104 is part of an integrated circuit 106 having a power source terminal 111, a ground terminal 110 and coupled to receive an input signal 114 at terminal 124. The integrated circuit 106 further includes a control circuit 105. Control circuit 105 can for example be a pulse width modulator (PWM) controller in a power conversion circuit or any other suitable controller applied to control power transistors in an electronic circuit.

When coupling discrete power transistors as shown in FIG. 1, it is important to take account of the electrical characteristics of these power transistors. For example, the use of resistors 102 and 103 coupled between driver 104 output and power transistor control terminals 120 and 123, is important to reduce oscillations that can otherwise occur when driver 104 is driving the control terminals 120 and 123 on and off. Furthermore, it is important to minimize the difference in physical length of connections 107 and 108 and connections 125 and 116. These connections have parasitic inductance and capacitance elements that influence the switching speed at turn on and turn off of power transistors 100 and 101. In order to ensure efficient switching of power transistors 100 and 101, the matching of these parasitic elements is important and the physical layout of the circuit requires careful attention. The physical area of the loops set up between the decoupling capacitor 112 positive terminal 126, the control terminals, 120 and 123 of power transistors 100 and 101 and the return connections 116 ands 125 to capacitor 116 negative terminal 127, also needs to be minimized and matched to reduce the influence of parasitic inductance and capacitance elements in these loops.

In addition to the physical layout considerations above, the drive capabilities of the drive circuit 104 limits the number of discrete power transistors that can be configured as shown in FIG. 1. Each discrete power transistor control terminal requires electrical energy to be driven according to the requirements and the maximum capability of driver circuit 104 to deliver this electrical energy limits the number of discrete power transistors that can be connected to extend the power transistor size.

Figure 2:
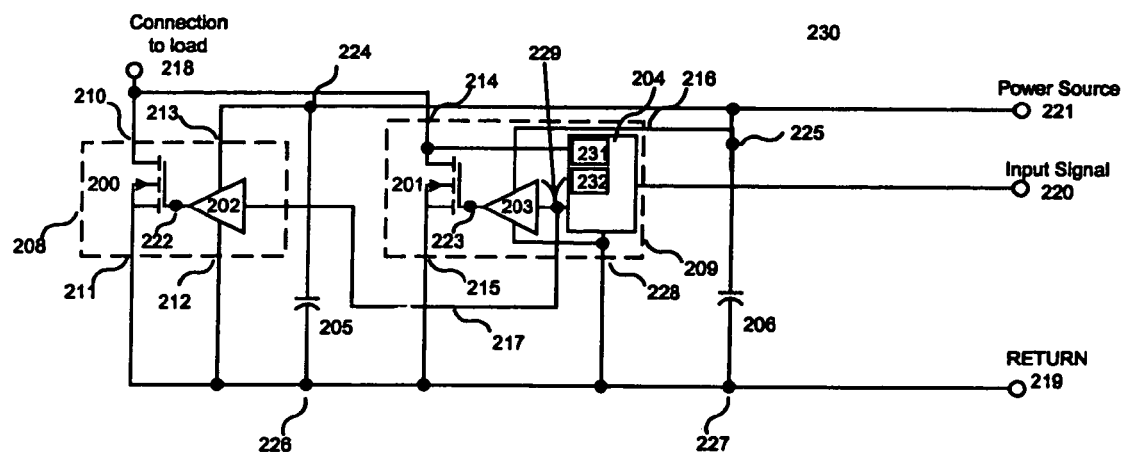
FIG. 2 is a schematic illustrating one embodiment of a circuit wherein the size of the power transistor has been extended by coupling a plurality of integrated circuits in accordance with the teachings of the present invention.

FIG. 2 shows generally one embodiment of a circuit in accordance with the teachings of the present invention. As shown, integrated circuit chip 209 includes a power transistor 201, a driver circuit 203 and a control circuit 204. Integrated circuit chip 208 includes a power transistor 200 and a driver circuit 202. In common with the configuration of FIG. 1, the output terminals 214 and 215 of power transistor 201 are coupled to the output terminals 210 and 211 respectively of power transistor 200 as shown. However, the control signal output 229, of control circuit 204, is coupled to the inputs of driver circuits 203 and 202 as shown. The output of driver circuit 203 is coupled to the control terminal 223 of power transistor 201 and the output of driver circuit 202 is coupled to the control terminal 222 of power transistor 200. In various embodiments, power transistors 200 and 201 may be implemented with field effect transistors (FETs), metal oxide field effect transistors (MOSFETs), bipolar transistors or other suitable types of devices.

As shown in the depicted embodiment, the power source terminals 213 and 216 of integrated circuits 208 and 209 respectively are coupled to a single power source 221. However, the fact that the driver circuit 203 and power transistor 201 are both part of integrated circuit chip 209 allows the power source for integrated circuit chip 208 to be decoupled by capacitor 206 close to the integrated circuit chip 209. In turn, the fact that the driver 202 and power transistor 200 are both part of integrated circuit chip 208 allows the power source for integrated circuit chip 208 to be decoupled with capacitor 205 close to integrated circuit chip 208.

The fact that these decoupling capacitors 205 and 206 can be located close to their respective integrated circuit chips 208 and 209 reduces the parasitic effects when driving the respective power transistors 200 and 201, discussed above with relation to FIG. 1. In accordance with the teachings of the present invention, the physical separation between integrated circuit chips 208 and 209 is therefore much less important than the physical separation between integrated circuit 106 and power transistors 100 and 101 in the circuit of FIG. 1, since the control signal coupled through connection 217 is typically a low power digital signal and therefore less prone to the parasitic effects of the higher power driver circuit output signal 109 in FIG. 1.

Furthermore, the integration of power transistor and driver circuits according to embodiments of the present invention means that the driver circuit size is extended in proportion to the extension of the power transistor. It is therefore possible to couple many more power transistors according to embodiments of the present invention than was previously possible with discrete power transistors being driven with a single drive circuit 104 as shown on FIG. 1.

The embodiment depicted in FIG. 2 can also be considered as including a master integrated circuit chip 209, having a master semiconductor switch 201 and master driver circuit 203 and a slave integrated circuit chip 208 having a slave semiconductor switch 200 and a slave driver circuit 202. The master slave description helps illustrate the fact that master integrated circuit chip 209 can be designed to integrate many or all control and protection functions necessary in the circuit 230.

For example, in one embodiment, master control circuit 204 includes a current sense circuit 231 which is used to sense the current flowing in master semiconductor switch 201 between master switch terminals, 214 and 215. If the master semiconductor switch is a metal oxide field effect transistor (MOSFET), the current may be sensed for example by master control circuit 204 current sense circuit 231 by sensing the voltage drop across the on-resistance of the master semiconductor switch 201 when it is on. When the voltage drop across the on-resistance of the master semiconductor switch 201 exceeds a threshold value, the MOSFET is normally switched off. Current sensed in the main semiconductor switch 201 can be used to control current flowing in the slave semiconductor switch 200, since the current flowing in master semiconductor switch 201 is representative of the current flowing in slave semiconductor switch 200 when both switches are on.

If for example the current sense circuit 231 of master control circuit 204 determines that the main semiconductor switch 201 should be turned off, the control circuit 204 master control signal 229 is also received by slave driver circuit 202 which in turn causes slave semiconductor switch 200 to be turned off. The same theory can be applied to other control functions such as thermal protection. For example, in one embodiment master control circuit 204 includes a temperature sense circuit 232 thermally coupled to sense the temperature master semiconductor switch 201. If master control circuit 204 temperature sense circuit 232 determines that the temperature of master semiconductor switch 201 is too high, the master control signal 229 will cause both master and slave semiconductor switches 200 and 201 to turn off to control the power dissipation in both semiconductor switches 200 and 201.

Figure 3:
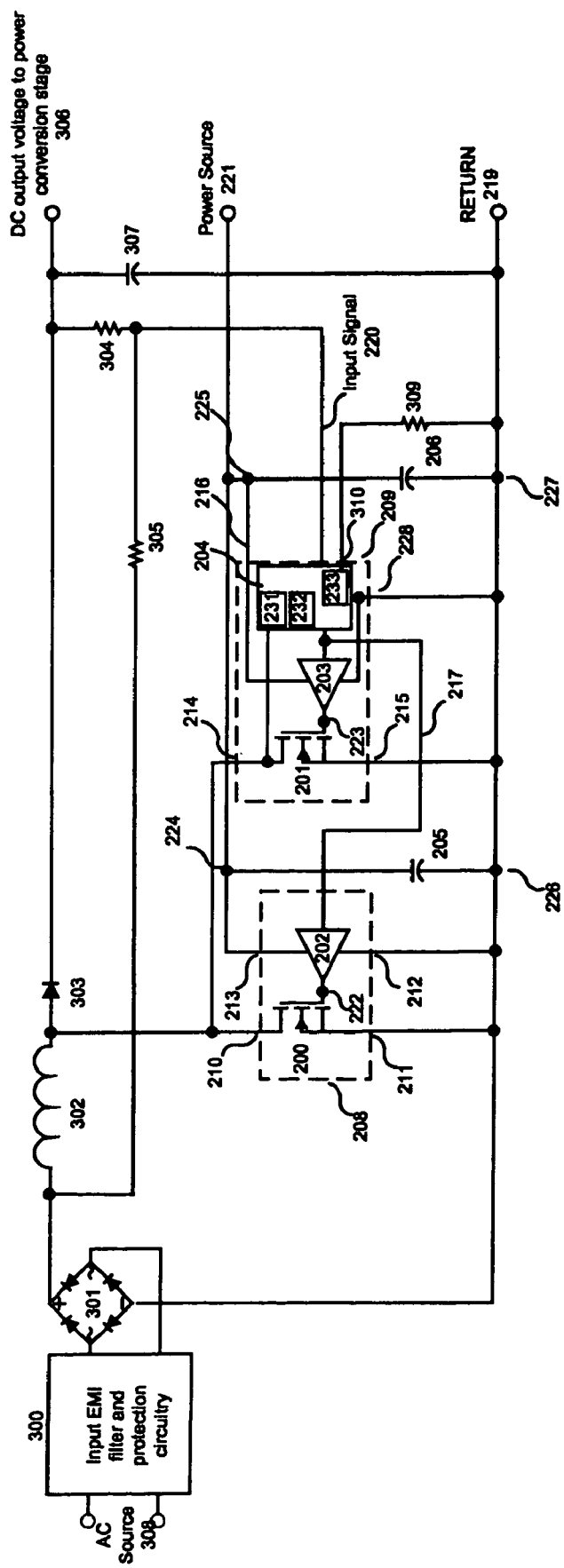
FIG. 3 is a schematic illustrating another embodiment of a circuit wherein the size of the power transistor has been extended by coupling a plurality of integrated circuits in accordance with the teachings of the present invention.

FIG. 3 shows generally another embodiment of a circuit in accordance with the teachings of the present invention. In the depicted embodiment, the circuit elements shown in FIG. 2 are shown in FIG. 3 in a boost converter circuit. The general configuration of the converter with input alternating current (AC) source 308, rectifier circuit 301, boost inductor 302, boost diode 303 and output bulk capacitor 307 will be familiar to one skilled in the art. In the configuration shown, the circuit is configured as a power factor correction (PFC) controller to perform a PFC function, the requirements of which will again be familiar to one skilled in the art.

In the illustrated embodiment, the input signal 220 to master integrated circuit chip 209 is derived from a combination of current flowing through resistors 304 and 305, which provide the control signal required by master control circuit 204 to perform the PFC function. In one embodiment, the direct current (DC) output voltage 306 is generally used to provide the input for a subsequent power conversion stage as shown. This power conversion stage could for example be a switched mode power supply. In one embodiment, power source 221 is derived from the power conversion stage or from a separate auxiliary power supply. It is appreciated that in other embodiments, master control circuit 204 may be implemented in accordance with the teachings of the present invention may also be implemented in other designs including but not limited to switched mode regulators, alternating current (AC) to direct current (DC) power supplies, power amplifiers, motor control circuits, analog and digital audio amplifiers or other suitable types of circuits.

As illustrated in the depicted embodiment, one other terminal 310 of the master control circuit 204 is coupled to a resistor 309, which is further coupled to return 219 or ground. In one embodiment, master control circuit includes a current limit adjustment circuit 233 coupled to terminal 310 to control or adjust the current limit threshold of master control circuit 204. This current limit adjustment circuit 233 need only be included in the master control circuit 204 of the master integrated circuit chip 209 since the master control signal 229 is applied to both master and slave driver circuits 203 and 204 respectively.

In the foregoing detailed description, the present invention has been described with reference to specific exemplary embodiments thereof. It will, however, be evident that various modifications and changes may be made thereto without departing from the broader spirit and scope of the present invention. For example, extending the size of a power transistor beyond on integrated circuit could be used in DC input as well as AC input circuits and is applicable to power amplifiers as well as the power conversion circuits discussed here. The present specification and figures are accordingly to be regarded as illustrative rather than restrictive.

What is claimed is:

1. A circuit, comprising:
   first and second power switches included in first and second integrated circuit chips, respectively, wherein first and second terminals on the first power switch are coupled to corresponding first and second terminals on the second power switch;
   first and second driver circuits included in the first and second integrated circuit chips, respectively, the first and second driver circuits both coupled to receive a single control signal, wherein the first driver circuit is coupled to drive a third terminal of the first power switch to switch the first power switch with the single control signal, wherein the second driver circuit is coupled to drive a third terminal of the second power switch to switch the second power switch with the single control signal.

2. The circuit of claim 1 wherein the first and second driver circuits are coupled to be powered by a single power source.

3. The circuit of claim 1 wherein the first and second power switches comprise field effect transistors (FETs).

4. The circuit of claim 3 wherein the first and second power switches comprise metal oxide semiconductor field effect transistors (MOSFETs).

5. The circuit of claim 1 wherein the first and second power switches comprise bipolar transistors.

6. The circuit of claim 1 further comprising a control circuit included in the first integrated circuit chip, wherein the single control signal is an output of the control circuit.

7. The circuit of claim 6 wherein the control circuit comprises a current sense circuit coupled to the first power switch to sense a current through the first power switch, the control circuit coupled to control the current through the first power switch and a current through the second power switch with the single control signal.

8. The circuit of claim 6 wherein the control circuit comprises a temperature sense circuit coupled to the first power switch to sense a temperature of the first power switch, the control circuit coupled to control power dissipation in the first and second power switches with the single control signal.

9. The circuit of claim 6 wherein the control circuit comprises a switched mode regulator circuit.

10. The circuit of claim 6 wherein the control circuit comprises a power factor controller circuit.

11. The circuit of claim 6 wherein the control circuit comprises an amplifier circuit.

12. The circuit of claim 1 wherein the circuit is included in a switched mode power supply.

13. The circuit of claim 1 wherein the circuit is included in an alternating current (AC) to direct current (DC) power supply.

14. The circuit of claim 1 wherein the circuit is included in a direct current (DC) to DC power supply.

15. The circuit of claim 1 wherein the circuit is included in a power factor correction circuit.

16. The circuit of claim 1 wherein the circuit is included in a power amplifier circuit.

* * * * *